US007422950B2

(12) United States Patent
Curello et al.

(10) Patent No.: US 7,422,950 B2
(45) Date of Patent: Sep. 9, 2008

(54) STRAINED SILICON MOS DEVICE WITH BOX LAYER BETWEEN THE SOURCE AND DRAIN REGIONS

(75) Inventors: Giuseppe Curello, Portland, OR (US);
Hemant V. Deshpande, Beaverton, OR (US); Sunit Tyagi, Portland, OR (US);
Mark Bohr, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 217 days.

(21) Appl. No.: 11/304,351

(22) Filed: Dec. 14, 2005

(65) Prior Publication Data

US 2007/0134859 A1    Jun. 14, 2007

(51) Int. Cl.
*H01L 21/84* (2006.01)
(52) U.S. Cl. ............... 438/300; 438/151; 257/E21.561
(58) Field of Classification Search ................. 438/300, 438/151–166; 257/E21.561
See application file for complete search history.

(56) References Cited

U.S. PATENT DOCUMENTS

| 6,048,756 | A | 4/2000 | Lee et al. |
| 6,495,402 | B1 | 12/2002 | Yu et al. |
| 6,515,335 | B1 | 2/2003 | Christiansen et al. |
| 2005/0082616 | A1 | 4/2005 | Chen et al. |
| 2005/0260807 | A1 | 11/2005 | Orlowski et al. |

| 2006/0186484 | A1* | 8/2006 | Chau et al. ................. 257/401 |

FOREIGN PATENT DOCUMENTS

WO    WO 2007/102870 A3    9/2007

OTHER PUBLICATIONS

PCT International Search Report and Written Opinion of the International Search Authority, Application No. PCT/US2006/047139, mailed Sep. 28, 2007.
Pending U.S. Appl. No. 11/031,843, filed Jan. 6, 2005; inventor: Sunit Tyagi et al.
Jurczak et al: Dielectric Pockets—A New Concept of the Junctions for Deca-Nanometric CMOS Devices; IEEE Transactions on Electron Devices, vol. 48, No. 8, Aug. 2001; pp. 1770-1774.
Min Yang et al.; Hybrid-Orientation Technology (HOT): Opportunities and Challenges.; IEEE Transactions on Electron Devices, vol. 53, No. 5, May 2006; pp. 965-978.

* cited by examiner

*Primary Examiner*—Richard A. Booth
(74) *Attorney, Agent, or Firm*—Rahul D. Engineer

(57) ABSTRACT

A MOS device comprises a gate stack comprising a gate electrode disposed on a gate dielectric, a first spacer and a second spacer formed on laterally opposite sides of the gate stack, a source region proximate to the first spacer, a drain region proximate to the second spacer, and a channel region subjacent to the gate stack and disposed between the source region and the drain region. The MOS device of the invention further includes a buried oxide (BOX) region subjacent to the channel region and disposed between the source region and the drain region. The BOX region enables deeper source and drain regions to be formed to reduce transistor resistance and silicide spike defects while preventing gate edge junction parasitic capacitance.

13 Claims, 6 Drawing Sheets

STRAINED SILICON MOS DEVICE WITH BOX LAYER BETWEEN THE SOURCE AND DRAIN REGIONS

BACKGROUND

Increased performance of integrated circuit devices on a semiconductor substrate, such as transistors, resistors, and capacitors, is usually a major factor considered during design, manufacture, and operation of those devices. For example, during design and manufacture of metal-oxide semiconductor (MOS) transistor devices, such as those used in a complementary metal-oxide semiconductor (CMOS), it is often desired to increase mobility of electrons in N-type MOS device (NMOS) channels and to increase mobility of positive charged holes in P-type MOS device (PMOS) channels.

One technique for increasing the mobility of electrons and holes in MOS transistors uses strained silicon in the channel region of the transistor. Silicon atoms in the channel are neatly packed in a lattice structure. Stretching the lattice structure so the silicon atoms are farther apart than in their natural state makes NMOS transistors switch faster. Similarly, compressing the lattice structure makes PMOS transistors switch faster. This stretching and compressing is known as straining the silicon.

To strain the silicon in the channel region, the source and drain regions of the MOS transistor are etched and replaced with a silicon alloy that has a different lattice structure than the lightly-doped silicon channel region. The etching process removes the source/drain regions and undercuts the spacers that are adjacent to the transistor gate stack. This is shown in FIGS. 1 and 2. FIG. 1 illustrates a MOS transistor 100 built on a bulk silicon substrate 102. A raised source region 104 and a raised drain region 106 of the transistor 100 are filled with a silicon alloy 108 that imparts a strain on a channel region 110. As shown, an undercut 112 allows the silicon alloy 108 to fill in the region below a pair of spacers 114 that are formed on laterally opposite sides of a transistor gate stack 116.

FIG. 2 illustrates a similar MOS transistor 100 that has been formed upon a silicon-on-insulator (SOI) substrate 200. The SOI substrate 200 includes a buried oxide layer 202 that is sandwiched between a thin device layer of silicon 204 and a bulk layer of silicon 206. The transistor 100 shown here includes the source region 104 and the drain region 106 that are filled with the silicon alloy 108 to impart a strain on the channel region 110. Again, the undercut 112 allows the silicon alloy 108 to fill in the region below the spacers 114.

The depth of the undercut is chosen based on tradeoffs between performance and the short channel effect (SCE). Undercuts that are too deep can degrade the SCE because the separation between the source and drain regions becomes very small, resulting in an increase in subsurface punch-through leakage. In addition, deep undercuts increase the gate edge junction parasitic capacitance due to the long vertical walls that are formed on either side of the channel region.

Deep undercuts, however, are beneficial because they allow for increased silicon strain and lower electrical resistance. The electrical resistance is lower because in shallow undercuts, the current has little room to spread before being collected from the contact, resulting in very high resistance. Deep undercuts also prevent silicide spike defects that can occur when the undercut depth is shallower than remaining oxide in adjacent shallow trench isolation (STI) structures. FIG. 3 illustrates a conventional configuration giving rise to a silicide spike defect. As shown, a transistor 300 is formed on an SOI substrate 302. The transistor 300 includes a shallow undercut region 304 that leaves a thin layer of silicon 306 atop a buried oxide layer 308. An adjacent STI structure 310 has a shallow height, generally due to processing, and this allows the thin layer of silicon 306 to come into contact with a subsequently deposited nickel metal layer 312. The contact between the thin layer of silicon 302 and the nickel metal layer 312 may cause a salicide spike defect.

Accordingly, an improved design is needed for sub-100 nm strained silicon MOS devices that can reduce electrical resistance within the source and drain regions and reduce gate edge parasitic capacitance while increasing mobility gain and protection from subsurface punch through.

DETAILED DESCRIPTION

Described herein are systems and methods of forming a MOS transistor that includes a buried oxide layer between the source and drain regions. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention provide systems and methods for a uniaxial strained MOS transistor that includes a buried oxide (BOX) layer between raised source and drain regions. Forming a BOX layer between the source and drain regions enables a deep undercut to be used while minimizing problems associated with conventional deep undercuts. In particular, the inclusion of a BOX layer between the source and drain regions allows deep undercuts to be used for reducing source/drain resistance and preventing salicide spike defects while suppressing the formation of a depletion layer that may cause gate edge parasitic capacitance.

Figure 1:
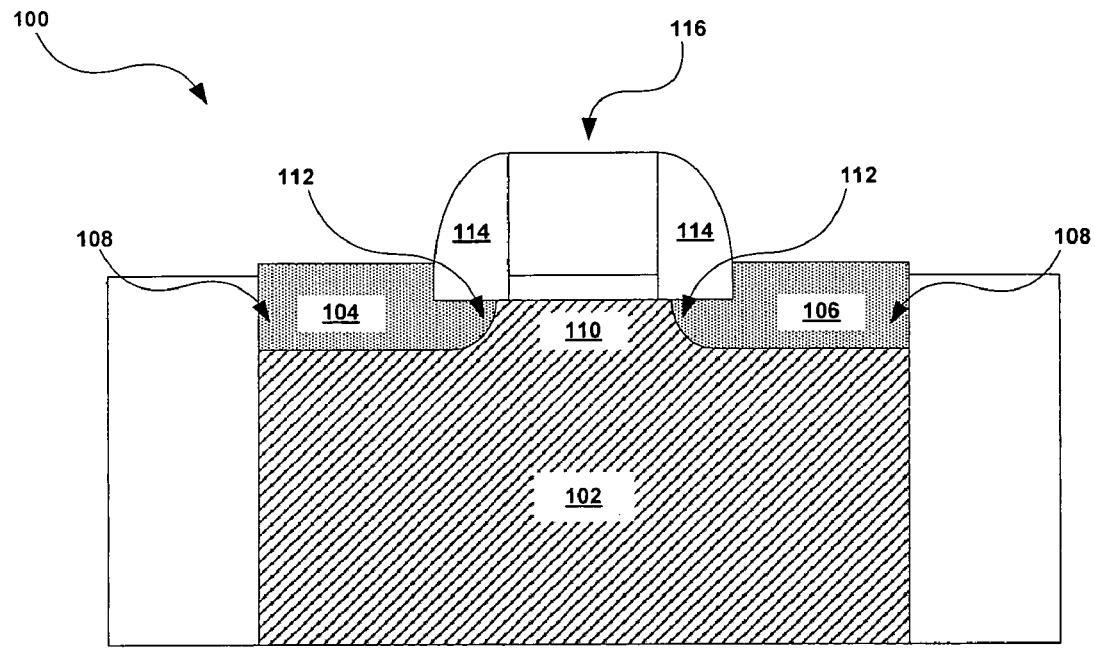
FIG. 1 illustrates a conventional MOS transistor built on a bulk silicon substrate.
Figure 2:
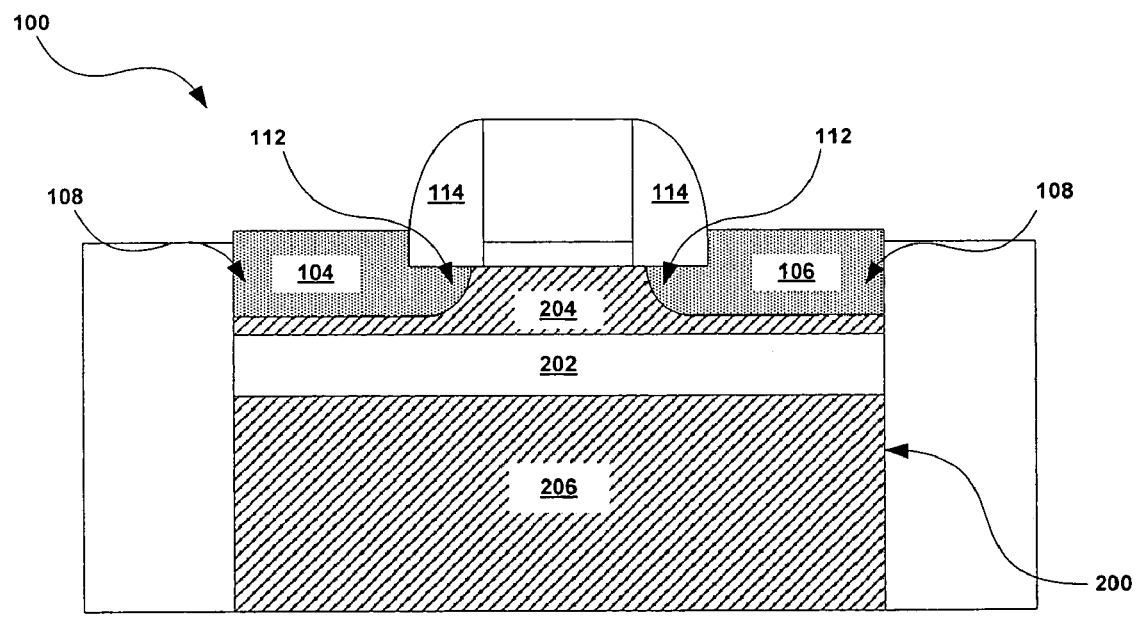
FIG. 2 illustrates a conventional MOS transistor built on an SOI substrate.
Figure 3:
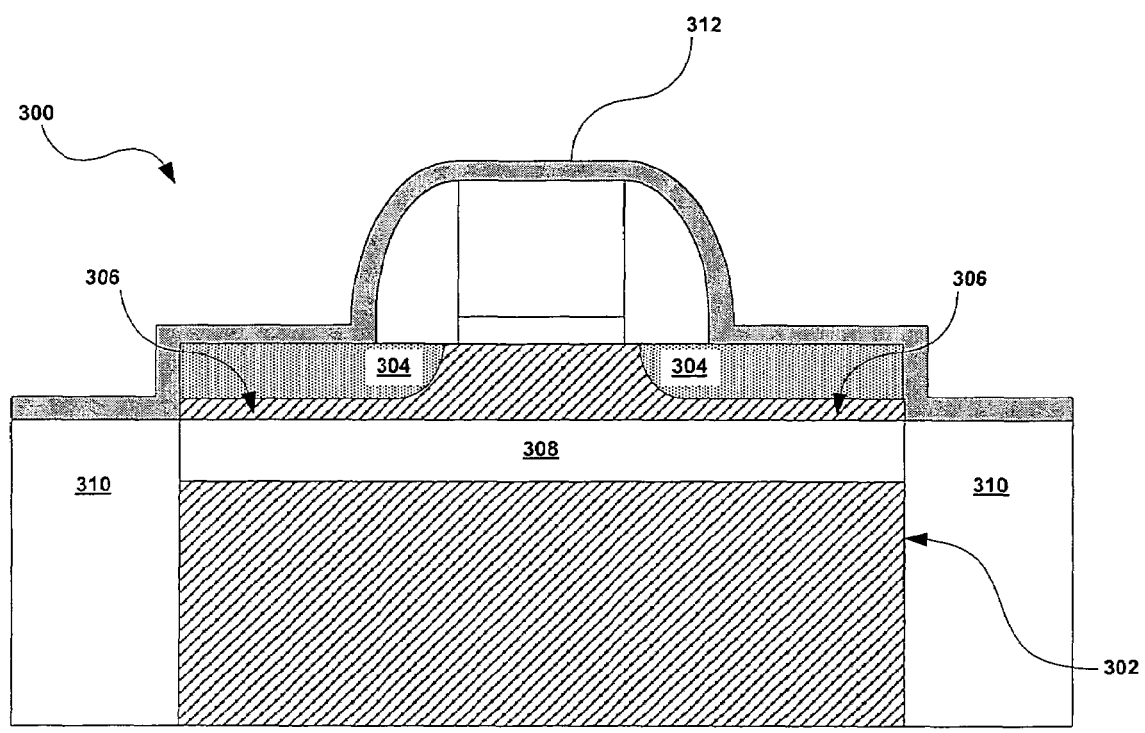
FIG. 3 illustrates a conventional MOS transistor with a silicide spike defect.
Figure 4:
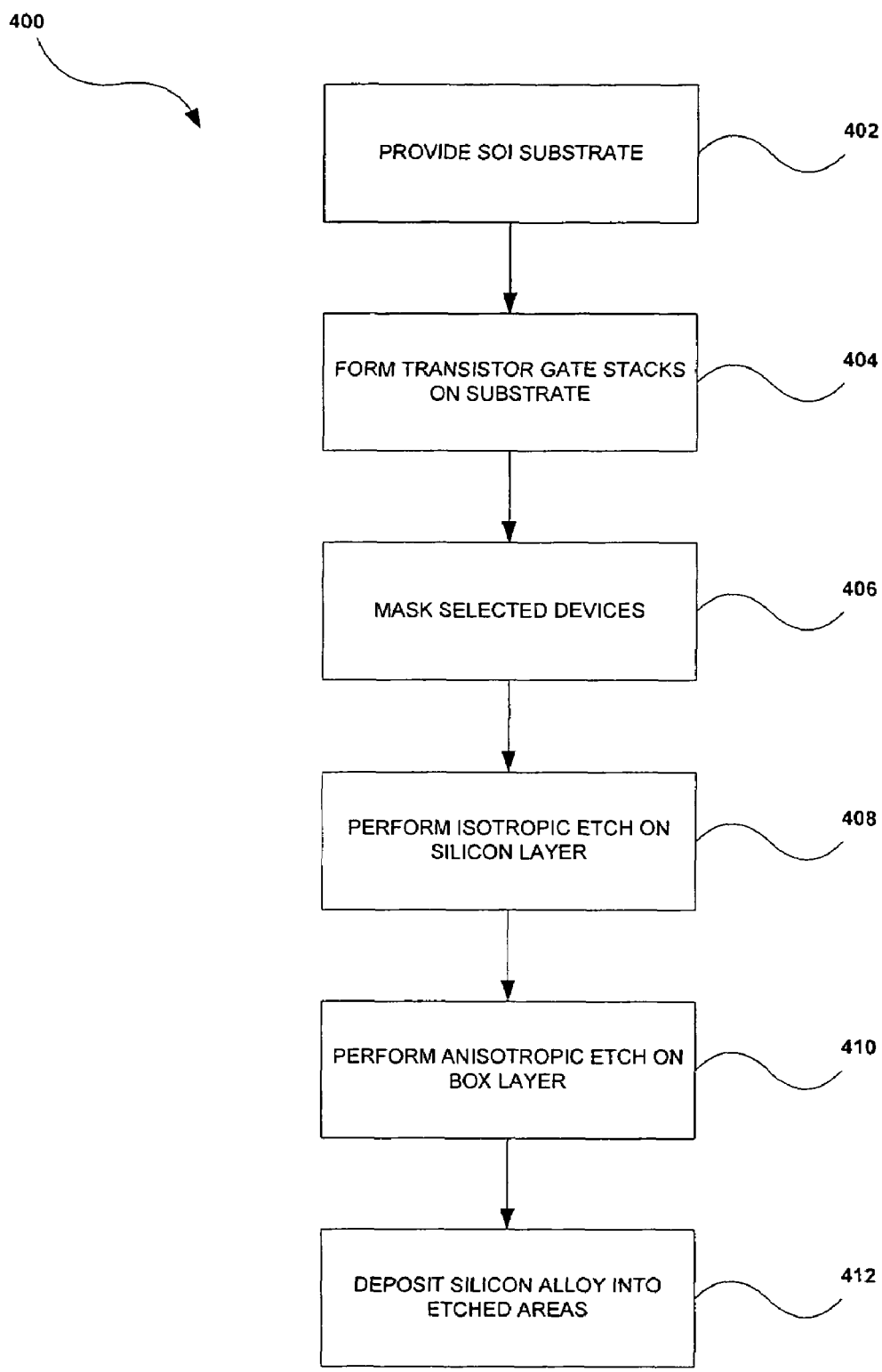
FIG. 4 is method of forming a transistor in accordance with an implementation of the invention.

FIG. 4 illustrates a method 400 for forming a MOS transistor in accordance with one implementation of the invention. FIGS. 5 to 9 illustrate structures that are formed when the method 400 is carried out. The description that follows will reference FIGS. 5 through 9 to further explain and clarify the various process stages of the method 400.

First, a fully depleted silicon-on-insulator (SOI) substrate is provided (402 of FIG. 4). As is well known in the art, an SOI wafer generally includes an insulating layer, such as a silicon oxide ($SiO_2$) layer, between a thin layer of silicon and a bulk silicon substrate. The insulating layer is therefore "buried" within the silicon and may be referred to as a buried oxide (BOX) layer. In alternate implementations, BOX layers other than $SiO_2$ may be used, including but not limited to carbon doped oxide (CDO), organic polymers, perfluorocyclobutane (PFCB), oxynitrides, and fluorosilicate glass (FSG). In some implementations, the BOX layer may be doped with a dopant such as nitrogen.

Figure 5:
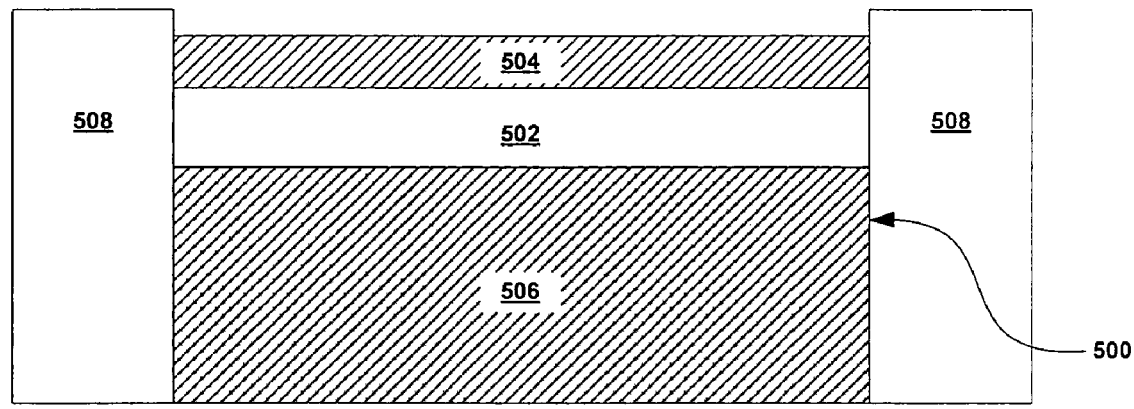
FIGS. 5 to 9 illustrates structures that are formed when carrying out the method of FIG. 4.

FIG. 5 illustrates a conventional SOI wafer 500 with a BOX layer 502 formed between a thin layer of silicon 504 and a bulk silicon substrate 506. One or more integrated circuit devices, such as transistors, may be formed on the thin layer of silicon 504. The presence of the BOX layer 502 generally reduces capacitance, therefore the amount of electrical charge that each transistor has to move during a switching operation is generally reduced, making the transistor faster and allowing it to switch using less energy. In many instances, integrated circuits built on SOI wafers can be faster and use less power than conventional CMOS integrated circuits. The SOI wafer 500 may also include STI structures 508 to electrically isolate devices, such as transistors, that will be formed.

In implementations of the invention, an SOI substrate formed using a separation by implantation of oxygen (SIMOX) process, known as a SIMOX wafer, is preferred to avoid any possible lattice mismatch issues during the later epitaxial growth. As is well known in the art, alternate SOI wafers, such as Smart Cut SOI wafers, may have some lateral offset between the BOX layer and the silicon body even though they have the same crystal orientation.

Figure 6:
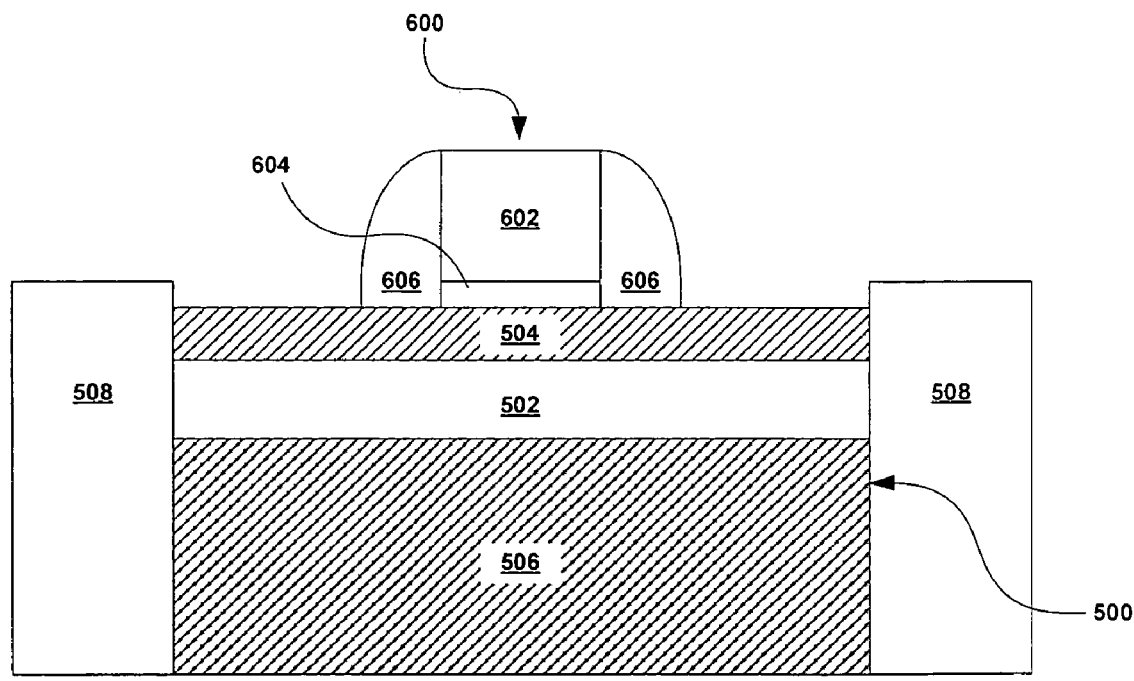

Transistor gate stacks for MOS devices, such as PMOS and/or NMOS devices, as well as any necessary spacers, are then formed atop the SOI wafer (404). In conventional CMOS processing, both PMOS and NMOS transistors are formed on the same silicon wafer. Therefore, some of the gate stacks will be used for building PMOS transistors while others of the gate stacks will be used for building NMOS transistors. FIG. 6 illustrates one transistor gate stack 600 that has been formed atop the SOI wafer 500 between STI structures 508. As is well known in the art, each transistor gate stack 600 includes at least a gate electrode 602 and a gate dielectric 604. A pair of spacers 606 is generally formed on laterally opposing sides of the transistor gate stack 600.

In some implementations, the gate dielectric 604 may be formed from silicon dioxide ($SiO_2$) that is epitaxially grown. The gate electrode 602 may be formed by depositing and etching a layer of polysilicon. Conventional photolithography techniques may be used to pattern the polysilicon to form the gate electrode 602. In this implementation, the transistor gate stack 600 may further include a silicide layer atop the polysilicon gate electrode (not shown). For instance, a nickel layer may be deposited upon the transistor gate stack 600 and annealed to form a nickel silicide layer. Conventional metal deposition processes, such as a sputtering deposition process, may be used to deposit the nickel layer.

In other implementations, the gate dielectric 604 may be formed of a high-k dielectric material and the gate electrode 602 may be formed using a metal or metal alloy. Such transistors are known as high-k/metal gate transistors. High-k dielectric materials that may be used as the gate dielectric 604 include, but are not limited to, hafnium oxide, hafnium silicon oxide, hafnium silicon oxynitride, lanthanum oxide, zirconium oxide, zirconium silicon oxide, tantalum oxide, titanium oxide, barium strontium titanium oxide, BST, barium titanium oxide, strontium titanium oxide, yttrium oxide, aluminum oxide, lead scandium tantalum oxide, lead zinc niobate, and PZT, as well as other hafnium (Hf)-based or zirconium (Zr)-based materials. In some implementations, the high-k dielectric material may be annealed. Metals or metal alloys that may be used as the gate electrode 602 include, but are not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, or a conductive metal oxide.

In some implementations, the high-k/metal gate transistor gate stack may be formed by first forming the spacers. A layer of high-k dielectric material is then deposited between the spacers and annealed. Finally, a layer of metal or metal alloy is deposited atop the high-k dielectric material and planarized to form a metal gate electrode. A conventional chemical mechanical polishing (CMP) process may be used to planarize the deposited metal.

In other implementations, the high-k/metal gate transistor gate stack may be formed by first depositing the high-k dielectric material onto the SOI wafer and annealing the high-k dielectric material. The high-k dielectric material may then be etched to form a gate dielectric. A pair of spacers may be formed on laterally opposing edges of the gate dielectric and a metal or metal alloy layer may be deposited atop the high-k dielectric material. The metal layer may then be planarized, for instance by CMP, to form a metal gate electrode.

The spacers 606 may be formed using a material such as silicon nitride. The spacer material may be the same regardless of whether the transistor gate stack 600 consists of $SiO_2$/polysilicon or high-k/metal.

In some implementations, a source region and a drain region (not shown) may optionally be formed by implanting dopants into regions of the thin layer of silicon 504 that are adjacent to the spacers 606. Dopants that may be used to form the source and drain regions are well known in the art, such as arsenic, phosphorous, and/or antimony to form N-type regions and boron and/or aluminum to form P-type regions. A high temperature annealing process may be used to activate the dopants to complete formation of the source and drain regions. The formation of doped source and drain regions is not necessary, although, as is known in the art, the presence of highly-doped source and drain regions may assist with subsequent etching processes.

After the transistor gate stacks and spacers are formed, one group of gate stacks is masked off from subsequent etching and deposition processes that are described below (406). In accordance with the invention, the etching and deposition processes needed to build PMOS transistors are different than the etching and deposition processes needed to build NMOS transistors. For instance, if the source and drain regions have been formed, the dopants used in a PMOS transistor are different than the dopants used in an NMOS transistor, therefore different etching processes may be necessary. Furthermore, the silicon alloys that will be used in the PMOS transistors to impart a compressive strain are different than the silicon alloys that will be used in the NMOS transistors to impart a tensile strain. Therefore, if PMOS transistors are being formed in accordance with implementations of the invention, the transistor gate stacks for the NMOS transistors are blocked with a masking material. Similarly, if NMOS transistors are being formed in accordance with implementations of the invention, the transistor gate stacks for the PMOS transistors are blocked with a masking material.

Materials that may be used to mask a group of transistors include, but are not limited to, oxides, nitrides, oxynitrides, and other similar materials. In implementations of the invention, the masking material may be deposited over the SOI wafer and conventional photolithography techniques may be used to pattern the masking material to expose the appropriate transistor gate stacks.

An isotropic etching process is then performed to remove at least a portion of the thin layer of silicon adjacent to the spacers that corresponds to regions where the source and drain regions are to be formed (408). In implementations of the invention, the isotropic etching process removes the silicon down to the BOX layer of the SOI wafer. The isotropic etching process also forms undercut regions subjacent to the spacers. These undercut regions may be laterally close to the edges of the transistor gate stack.

In some implementations of the invention, the isotropic etching process may be carried out with a dry etching process using sulfur hexafluoride ($SF_6$) and/or nitrogen trifluoride ($NF_3$). In alternate implementations, a wet etch process may be used using materials such as tetramethyl-ammonium hydroxide (TMAH). As will be recognized by those of skill in the art, alternative isotropic etching processes may be used here as well.

Figure 7:
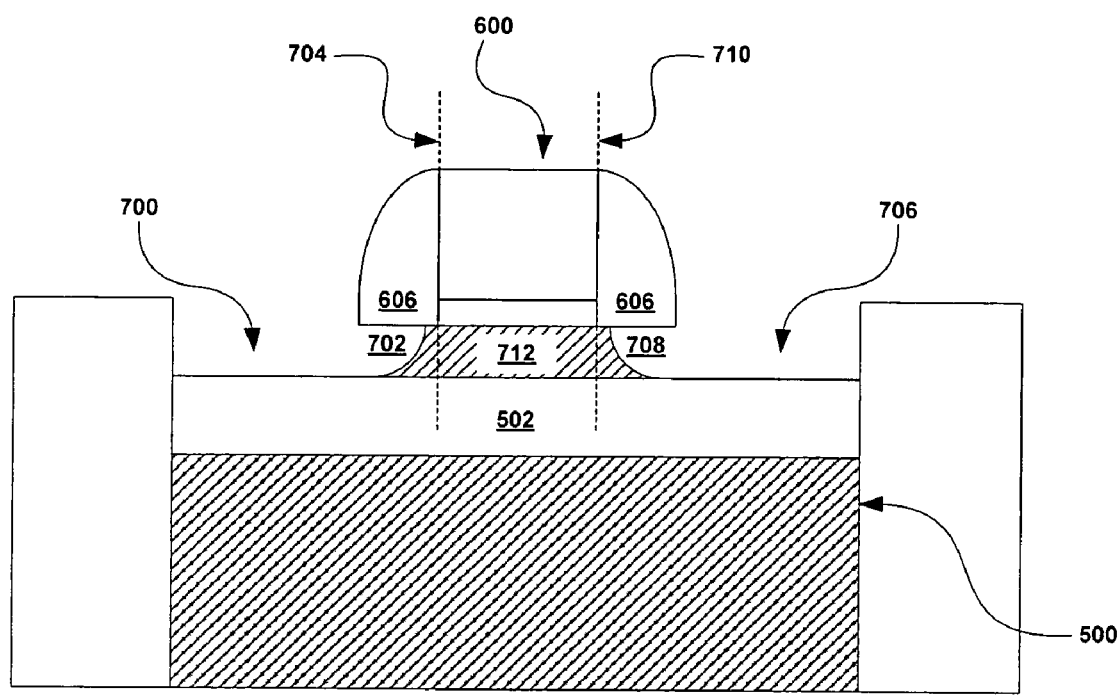

FIG. 7 illustrates the SOI wafer 500 with the etched source and drain regions. As shown, a first cavity region 700 is formed down to the BOX layer 502 that includes an undercut region 702 subjacent to one of the spacers 606. An interior edge of the undercut region 702 is laterally close to an edge 704 of the transistor gate stack 600. Similarly, a second cavity region 706 is formed down to the BOX layer 502 that includes an undercut region 708 subjacent to another one of the spacers 606. An interior edge of the undercut region 708 is laterally close to an edge 710 of the transistor gate stack 600. The portion of the thin layer of silicon 504 that remains forms the channel region of the MOS transistor. This region will now be referenced as channel region 712.

Next, an anisotropic etching process is performed to remove portions of the BOX layer below the cavity regions that were formed during the isotropic etching process (410). In implementations of the invention, the anisotropic etching process removes the BOX layer down to the bulk silicon substrate of the SOI wafer. In one implementation, the anisotropic etching process may be carried out with dry etch process using $C_5F_8$ gas. As will be recognized by those of skill in the art, alternative anisotropic etching processes may be used here as well.

Figure 8:
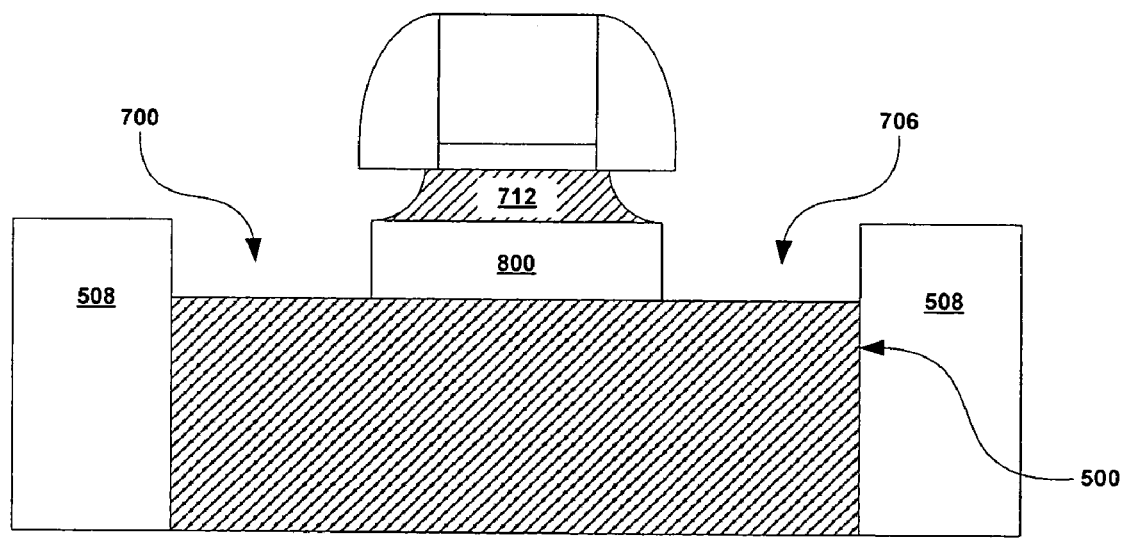

FIG. 8 illustrates the SOI wafer 500 with the etched BOX layer 502, which is hereinafter referred to as a BOX region 800. As shown, the first cavity region 700 and the second cavity region 706 now incorporate the voids left by the etching of the BOX layer 502. Because the etching process used to remove the BOX layer 502 is an anisotropic process, the portion of the BOX layer 502 subjacent to the channel region 712 (i.e., the BOX region 800) is not substantially removed. Furthermore, as shown in FIG. 8, the anisotropic etching process that removes portions of the BOX layer 502 may also remove portions of the STI structures 508.

A deposition process is then carried out to fill the first cavity and the second cavity with an appropriate silicon alloy (e.g., $Si_xY_z$) that is capable of imparting a strain on the channel region of the transistor (412). The deposited silicon alloy forms the source and drain regions of the MOS transistor. In one implementation, an epitaxial deposition process may be used to fill the first and second cavities with the silicon alloy. In other implementations, alternate deposition processes such as physical vapor deposition, chemical vapor deposition, or atomic layer deposition may be used to deposit the silicon alloy into the cavities. In further implementations, non-silicon alloy materials may be used that are capable of functioning as source and drain regions and that are capable of imparting a strain on the channel region.

If a PMOS transistor is being formed, the silicon alloy that is deposited into the first and second cavities may be a material that imparts a compressive strain on the channel region of the transistor. In some implementations, a silicon germanium (SiGe) alloy may be used. An in-situ doping process may be carried out with the silicon alloy deposition to introduce a doping agent, such as boron or aluminum, into the silicon alloy to form P-doped regions.

If an NMOS transistor is being formed, the silicon alloy that is deposited into the first and second cavities may be a material that imparts a tensile strain on the channel region of the transistor. In some implementations, a silicon carbide (SiC) alloy may be used. Again, an in-situ doping process may be carried out during the silicon alloy deposition to introduce a doping agent, such as arsenic, phosphorous, and/or antimony, into the silicon alloy to form N-doped regions.

In implementations of the invention, the deposition of the silicon alloy may continue until raised source and drain regions are formed. Raised source and drain regions are well known in the art and consist of silicon alloy regions that have top surfaces that are non-planar with a top surface the channel region. The raised source and drain regions generally extend above the top surface of the channel region, thereby allowing the source and drain regions to apply a strain from above the channel region in addition to applying a strain from a direction that is level with the channel region.

Figure 9:
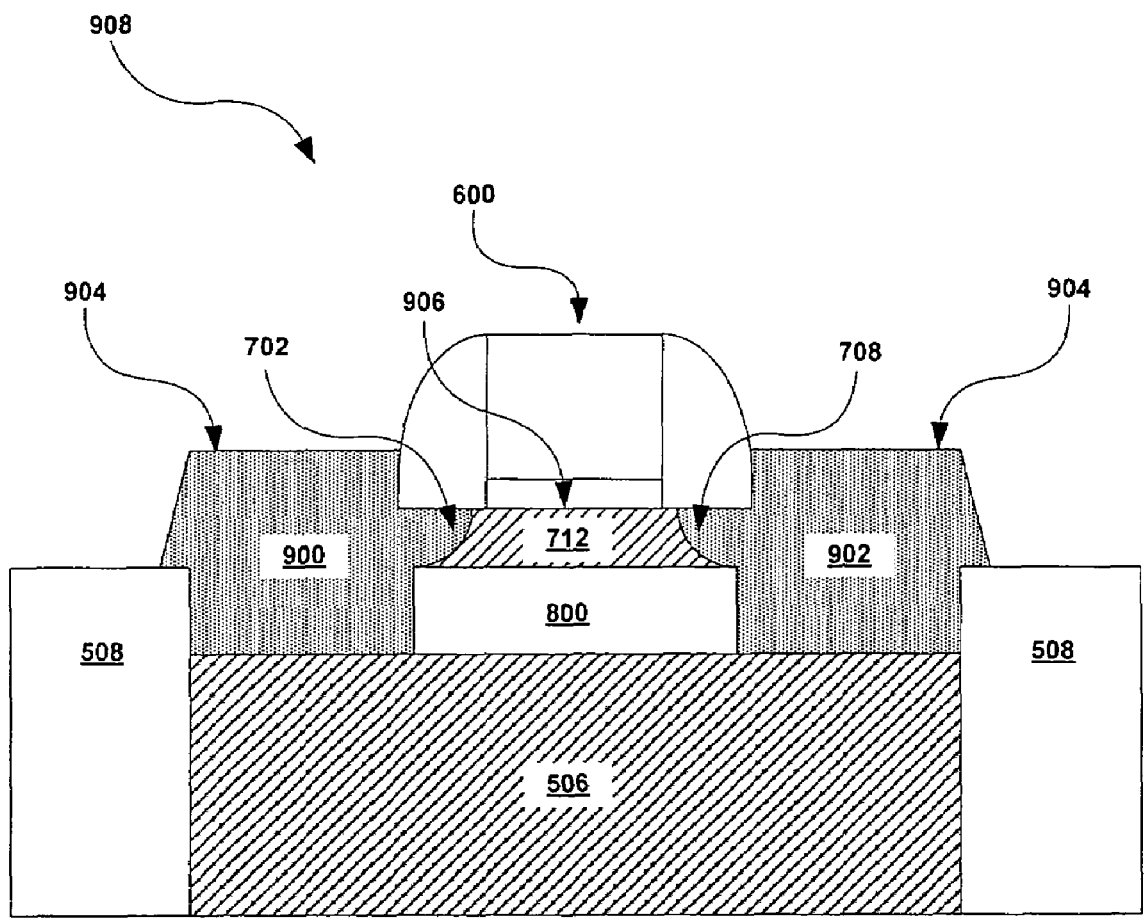

FIG. 9 illustrates a raised source region 900 and a raised drain region 902. As described, the source and drain regions 900/902 are formed by depositing a silicon alloy into the previously unfilled first and second cavity regions 700/708. For a PMOS transistor, the source and drain regions 900/902 generally consist of a SiGe material. For an NMOS transistor, the source and drain regions 900/902 generally consist of a SiC material. As shown, the top surfaces 904 of the source and drain regions 900/902 are raised relative to a top surface 906 of the channel region 712. With the deposition of the raised source and drain regions, a substantially complete MOS transistor 908 is formed. As will be recognized by those of skill in the art, further elements may be formed to make the MOS transistor 908 fully operational, such as electrical contacts to the source and drain regions 900/902.

The source and drain regions 900/902 of the invention provide several advantages over conventional source and drain regions. Due to the removal of portions of the BOX layer 502, the source and drain regions 900/902 extend below the channel region 712 in addition to extending above the channel region 712. This allows the source and drain regions 900/902 of the invention to apply a strain from above, at, and below the channel region 712, thereby improving the overall applied strain. And because the source and drain regions 900/902 extend down to the bulk silicon substrate 506, they are relatively larger than conventional source and drain regions. This allows the source and drain regions 900/902 of the invention to provide more space for electrical current, thereby reducing the overall electrical resistance of the MOS transistor 908.

Furthermore, as shown in FIG. 9, the source and drain regions 900/902 of the invention provide shallow depth close to the edge of the transistor gate stack 600 but still provide a large depth adjacent to the STI structures 508. The shallow depth close to the edges of the transistor gate stack 600 prevents a depletion layer from being formed on the vertical edges of the undercut regions 702/708, thereby reducing gate edge junction parasitic capacitance and improving the SCE. The presence of the BOX region 800 between the source region 900 and the drain region 902 contributes to reducing the gate edge junction parasitic capacitance because a depletion layer cannot form on the BOX region 800. In other words, although the undercut is deep, there are no long vertical walls formed on either side of the channel region 712 that can contribute to the gate edge junction parasitic capacitance. Meanwhile, the large depth adjacent to the STI structures 508 minimizes the risk of silicide spike defects.

Therefore, as will be recognized by those of skill in the art, the ability to provide shallow depth proximate to the transistor gate stack 600 and provide large depth adjacent to the STI structures 508 provides an additional degree of freedom to separately optimize source/drain series resistance, electron/hole mobility, and the SCE, while still protecting from salicide spike defects. This enables the manufacture of high-performance MOS devices with relatively smaller gate lengths. Once the MOS transistors 908 are formed in accordance with implementations of the invention, a standard CMOS flow may be utilized thereafter.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A method comprising:
   providing an SOI substrate that includes an oxide layer disposed between a first silicon layer and a second silicon layer;
   forming a transistor gate stack on the first silicon layer;
   forming a pair of spacers on laterally opposing sides of the transistor gate stack;
   isotropically etching the exposed portions of the first silicon layer until portions of the oxide layer are exposed;
   anisotropically etching the exposed portions of the oxide layer until portions of the second silicon layer are exposed; and
   depositing a silicon alloy on the exposed portions of the second silicon layer.

2. The method of claim 1, wherein the isotropic etching of the first silicon layer forms a channel region subjacent to the transistor gate stack.

3. The method of claim 2, wherein the anisotropic etching of the oxide layer forms a buried oxide region subjacent to the channel region.

4. The method of claim 1, wherein the isotropic etching is performed using a dry etching process with at least one of sulfur hexafluoride and nitrogen trifluoride.

5. The method of claim 1, wherein the anisotropic etching is performed using $C_5F_8$ gas.

6. The method of claim 1, wherein the isotropic etching forms a pair of undercut regions that are subjacent to the pair of spacers and laterally proximate to the sides of the transistor gate stack.

7. The method of claim 1, wherein the forming of the transistor gate stack and the pair of spacers comprises:
   forming the pair of spacers;
   depositing a high-k dielectric material between the spacers;
   annealing the high-k dielectric material;
   depositing a metal layer atop the high-k dielectric material; and
   planarizing the deposited metal to form a metal gate electrode.

8. The method of claim 1, wherein the forming of the transistor gate stack and the pair of spacers comprises:
   depositing a high-k dielectric material onto the first silicon layer;
   annealing the high-k dielectric material;
   etching the high-k dielectric material to form a gate dielectric;
   forming the pair of spacers on laterally opposing edges of the gate dielectric;
   depositing a metal layer atop the high-k dielectric material; and
   planarizing the deposited metal to form a metal gate electrode.

9. The method of claim 3, wherein the deposited silicon alloy forms a source region and a drain region.

10. The method of claim 9, wherein the source region and the drain region are separated by the channel region and the buried oxide region.

11. The method of claim 9, wherein the silicon alloy is deposited using an epitaxial process.

12. The method of claim 9, wherein the depositing of the silicon alloy comprises depositing the silicon alloy until a raised source region and a raised drain region are formed.

13. The method of claim 6, wherein the depositing of the silicon alloy includes depositing the silicon alloy into the undercut regions.

* * * * *